United States Patent
Guo et al.

(10) Patent No.: US 11,968,870 B2
(45) Date of Patent: Apr. 23, 2024

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yonglin Guo, Beijing (CN); Kai Zhang, Beijing (CN); Yunsheng Xiao, Beijing (CN); Tingliang Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 639 days.

(21) Appl. No.: 17/264,410

(22) PCT Filed: Jul. 20, 2020

(86) PCT No.: PCT/CN2020/103111
§ 371 (c)(1),
(2) Date: Jan. 29, 2021

(87) PCT Pub. No.: WO2021/017931
PCT Pub. Date: Feb. 4, 2021

(65) Prior Publication Data
US 2022/0190056 A1    Jun. 16, 2022

(30) Foreign Application Priority Data
Jul. 29, 2019   (CN) .......................... 201910690791.8

(51) Int. Cl.
*H10K 59/35*   (2023.01)
*G02F 1/1362*  (2006.01)
*H10K 59/131*  (2023.01)

(52) U.S. Cl.
CPC ..... *H10K 59/353* (2023.02); *G02F 1/136286* (2013.01); *H10K 59/131* (2023.02)

(58) Field of Classification Search
CPC ............... H10K 59/353; H10K 59/131; G02F 1/136286
(Continued)

(56) References Cited

U.S. PATENT DOCUMENTS

| 9,626,145 B1 | 4/2017 | Fu et al. |
| 9,814,106 B2 | 11/2017 | Hussain et al. |

(Continued)

FOREIGN PATENT DOCUMENTS

| CN | 106847174 A | 6/2017 |
| CN | 107369692 A | 11/2017 |

(Continued)

OTHER PUBLICATIONS

Chinese Office Action for corresponding 201910690791.8 dated Jan. 27, 2021.

*Primary Examiner* — Charles S Chang
(74) *Attorney, Agent, or Firm* — ArentFox Schiff LLP; Michael Fainberg (57) ABSTRACT

The present disclosure provides a display panel and a display device. The display panel includes a display region; the display region includes a first display region and a second display region arranged in a second direction; each scanning signal line in the first display region is electrically connected with less pixels than each scanning signal line in the second display region; the first display region is divided into a first sub-display region and a second sub-display region arranged in the second direction; and the first sub-display region is located at the side far away from the second display region.

13 Claims, 9 Drawing Sheets

(58) Field of Classification Search
USPC .......................................... 349/139, 143–148
See application file for complete search history.

(56) References Cited

U.S. PATENT DOCUMENTS

2018/0121153 A1   5/2018  Lee et al.
2020/0066809 A1   2/2020  Liu

FOREIGN PATENT DOCUMENTS

| CN | 107633802 A |   | 1/2018  |          |
|----|-------------|---|---------|----------|
| CN | 107705756 A |   | 2/2018  |          |
| CN | 107749247 A | * | 3/2018  | G09F 9/33 |
| CN | 107749247 A |   | 3/2018  |          |
| CN | 107833908 A |   | 3/2018  |          |
| CN | 108493227 A |   | 9/2018  |          |
| CN | 109637420 A |   | 4/2019  |          |
| CN | 109981842 A |   | 7/2019  |          |
| CN | 110364109 A |   | 10/2019 |          |
| TW | 201839977 A |   | 11/2018 |          |

* cited by examiner

DISPLAY PANEL AND DISPLAY DEVICE

CROSS REFERENCE TO RELATED APPLICATIONS

This application is a National Stage of International Application No. PCT/CN2020/103111, filed on Jul. 20, 2020, which claims priority to the Chinese Patent Application No. 201910690791.8, filed with the Chinese Patent Office on Jul. 29, 2019 and entitled "DISPLAY PANEL AND DISPLAY DEVICE", the entire contents of which are incorporated herein by reference.

FIELD

The present disclosure relates to the field of display, in particular to a display panel and a display device.

BACKGROUND

With rapid development, innovation and upgrading of mobile smart terminals, consumers have increasing individual requirements on mobile smart terminal devices, and a full-screen technology has become a mainstream technology in this field. In order to reserve a space for components, a display screen is generally configured as a special-shaped display screen.

SUMMARY

An embodiment of the present disclosure provides a display panel. The display panel includes: a display region, including a first display region and a second display region arranged in a second direction, where the first display region includes a first sub-display region and a second sub-display region arranged in the second direction, the first sub-display region is located at a side far away from the second display region, and the first sub-display region, the second sub-display region and the second display region each include: a plurality of pixels arranged in an array, where a pixel density of the first sub-display region is smaller than a pixel density of the second display region; a plurality of scanning signal lines, extending in a first direction and arranged in the second direction, where the number of pixels electrically connected to each scanning signal line in the first display region is less than the number of pixels electrically connected to each scanning signal line in the second display region, and the first direction is intersected with the second direction; and a plurality of fixed potential signal lines, extending in the second direction and arranged in the first direction, where the scanning signal lines and the fixed potential signal lines are arranged in different layers; in a direction perpendicular to the display panel, a first overlapping region exists between the scanning signal lines and the fixed potential signal lines in the first sub-display region, a second overlapping region exists between the scanning signal lines and the fixed potential signal lines in the second sub-display region, a third overlapping region exists between the scanning signal lines and the fixed potential signal lines in the second display region, and an area of the first overlapping region is at least larger than an area of the third overlapping region.

In a possible implementation, in the display panel provided by an embodiment of the present disclosure, each pixel includes a light emitting device and a drive circuit configured to drive the light emitting device; a pixel density of the second sub-display region is equal to the pixel density of the second display region; and in each of the pixels in the first sub-display region and the second sub-display region, the light emitting device is overlapped with the drive circuit.

In a possible implementation, in the display panel provided by an embodiment of the present disclosure, the area of the first overlapping region is larger than an area of the second overlapping region, and the area of the second overlapping region is larger than the area of the third overlapping region.

In a possible implementation, in the display panel provided by an embodiment of the present disclosure, the fixed potential signal lines have a same width in the first direction; and widths of the scanning signal lines in the first overlapping region in the second direction are larger than widths of the scanning signal lines in the second overlapping region in the second direction, and the widths of the scanning signal lines in the second overlapping region in the second direction are larger than widths of the scanning signal lines in the third overlapping region in the second direction.

In a possible implementation, in the display panel provided by an embodiment of the present disclosure, the scanning signal lines have a same width in the second direction; and widths of the fixed potential signal lines in the first overlapping region in the first direction are larger than widths of the fixed potential signal lines in the second overlapping region in the first direction, and the widths of the fixed potential signal lines in the second overlapping region in the first direction are larger than widths of the fixed potential signal lines in the third overlapping region in the first direction.

In a possible implementation, in the display panel provided by an embodiment of the present disclosure, widths of the scanning signal lines in the first overlapping region in the second direction are larger than widths of the scanning signal lines in the second overlapping region in the second direction, and the widths of the scanning signal lines in the second overlapping region in the second direction are larger than widths of the scanning signal lines in the third overlapping region in the second direction; and widths of the fixed potential signal lines in the first overlapping region in the first direction are larger than widths of the fixed potential signal lines in the second overlapping region in the first direction, and the widths of the fixed potential signal lines in the second overlapping region in the first direction are larger than widths of the fixed potential signal lines in the third overlapping region in the first direction.

In a possible implementation, in the display panel provided by an embodiment of the present disclosure, the pixel density of the first sub-display region is equal to a pixel density of the second sub-display region.

In a possible implementation, in the display panel provided by an embodiment of the present disclosure, each pixel includes a light emitting device, and a drive circuit configured to drive the light emitting device; drive circuits of pixels in the first sub-display region are located in the second sub-display region; and the scanning signal lines located in the first sub-display region are electrically connected to corresponding drive circuits located in the second sub-display region.

In a possible implementation, in the display panel provided by an embodiment of the present disclosure, the area of the first overlapping region is equal to an area of the second overlapping region.

In a possible implementation, in the display panel provided by an embodiment of the present disclosure, the scanning signal lines have a same width in the second direction; and widths of the fixed potential signal lines in the first overlapping region in the first direction are equal to widths of the fixed potential signal lines in the second overlapping region in the first direction, and the widths of the fixed potential signal lines in the first overlapping region in the first direction are larger than widths of the fixed potential signal lines in the third overlapping region in the first direction.

In a possible implementation, in the display panel provided by an embodiment of the present disclosure, the fixed potential signal lines have a same width in the first direction; and widths of the scanning signal lines in the first overlapping region in the second direction are equal to widths of the scanning signal lines in the second overlapping region in the second direction, and the widths of the scanning signal lines in the first overlapping region in the second direction are larger than widths of the scanning signal lines in the third overlapping region in the second direction.

In a possible implementation, in the display panel provided by an embodiment of the present disclosure, widths of the fixed potential signal lines in the first overlapping region in the first direction are equal to widths of the fixed potential signal lines in the second overlapping region in the first direction, and the widths of the fixed potential signal lines in the first overlapping region in the first direction are larger than widths of the fixed potential signal lines in the third overlapping region in the first direction; and widths of the scanning signal lines in the first overlapping region in the second direction are equal to widths of the scanning signal lines in the second overlapping region in the second direction, and the widths of the scanning signal lines in the first overlapping region in the second direction are larger than widths of the scanning signal lines in the third overlapping region in the second direction.

In a possible implementation, in the display panel provided by an embodiment of the present disclosure, the first sub-display region includes first pixel rows and second pixel rows; the number of pixels in the first pixel rows is less than the number of pixels in the second pixel rows; and an area of the first overlapping region corresponding to the first pixel rows is larger than an area of the first overlapping region corresponding to the second pixel rows.

In a possible implementation, in the display panel provided by an embodiment of the present disclosure, the scanning signal lines have a same width in the second direction; and in the first direction, widths of the fixed potential signal lines in the first overlapping region corresponding to the first pixel rows are larger than widths of the fixed potential signal lines in the first overlapping region corresponding to the second pixel rows.

In a possible implementation, in the display panel provided by an embodiment of the present disclosure, the fixed potential signal lines have a same width in the first direction; and in the second direction, widths of the scanning signal lines in the first overlapping region corresponding to the first pixel rows are larger than widths of the scanning signal lines in the first overlapping region corresponding to the second pixel rows.

In a possible implementation, in the display panel provided by an embodiment of the present disclosure, in the first direction, widths of the fixed potential signal lines in the first overlapping region corresponding to the first pixel rows are larger than widths of the fixed potential signal lines in the first overlapping region corresponding to the second pixel rows; and in the second direction, widths of the scanning signal lines in the first overlapping region corresponding to the first pixel rows are larger than widths of the scanning signal lines in the first overlapping region corresponding to the second pixel rows.

In a possible implementation, in the display panel provided by an embodiment of the present disclosure, the scanning signal lines include grid scanning signal lines and light emission control scanning signal lines.

In a possible implementation, in the display panel provided by an embodiment of the present disclosure, the fixed potential signal lines include power voltage signal lines.

In a possible implementation, in the display panel provided by an embodiment of the present disclosure, at least a partial edge of the first display region is a curved edge, a round corner, a chamfer or a notch, and each pixel row in the first display region extends to the curved edge, the round corner, the chamfer or the notch.

In a possible implementation, in the display panel provided by an embodiment of the present disclosure, the first display region includes a gap or a hollow part, and each pixel row in the first display region extends to the gap or the hollow part.

In another aspect, an embodiment of the present disclosure further provides a display device including the display panel provided by any one of the above embodiments.

DETAILED DESCRIPTION

A conventional mobile phone screen is rectangular and has a display ratio of 16:9 and four right-angled sides. If electronic elements such as a front camera and a sensor are disposed in a body of a mobile phone, a distance should be kept between the screen and an edge of the mobile phone. However, a full-screen mobile phone with a display ratio of 18:9 generally has a screen-to-body ratio greater than 80%, therefore the edge of the screen is quite close to the body of the mobile phone. If a mobile phone adopts a conventional right-angled side solution, there will be no space for disposing electronic elements, and also the screen is close to the body, accordingly the screen will bear a larger impact when falling down and is more likely to be broken. Therefore, it is quite necessary to design a screen in a non-right-angled special shape in order to reduce the possibility of breaking of the screen and reserving a space for elements.

Figure 1:
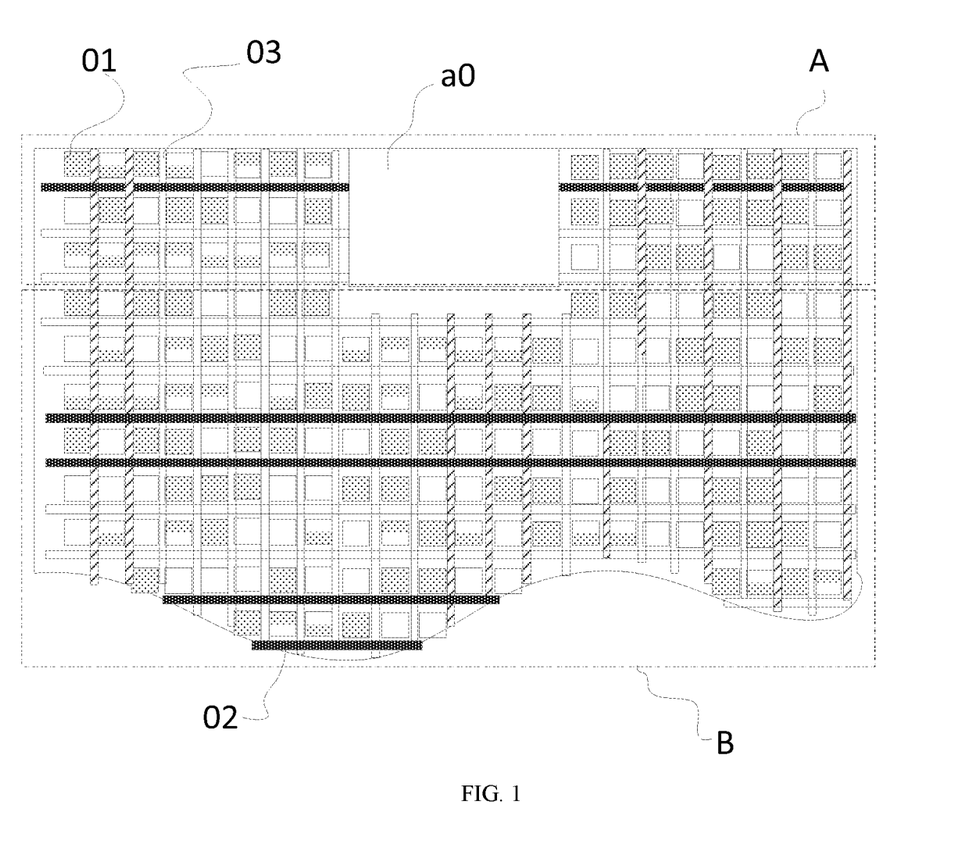
FIG. 1 is a schematic diagram of a structure of a display panel provided in the related art.

As shown in FIG. 1, a special-shaped area a0 may be arranged in the middle of an upper frame of a display screen to accommodate a camera, a photosensitive element (not specifically shown in the figure), etc. Therefore, no pixels 01 are arranged in the special-shaped area a0, resulting in a situation that scanning signal lines 02 in an area A with a special-shaped area a0 are connected with less pixels than scanning signal lines 02 in a normal display region B with no special-shaped area a0, namely the scanning signal lines 02 corresponding to a special-shaped area a0 has a smaller loading capacity. As a result, display regions of a display panel have different display brightness, and accordingly the display panel has a poor display uniformity.

Therefore, it is necessary to compensate the loading capacity of the scanning signal lines 02 in the area A. Compensation can be realized in a way of enlarging the overlapping regions between the scanning signal lines 02 and fixed potential signal lines 03. However, if a display panel requires a narrow frame, there may be no sufficient space at the position close to the upper frame of the display panel, resulting in a failure in compensating the loading capacity of the scanning signal lines 02.

Based on the above problems, an embodiment of the present disclosure provides a display panel and a display device. In order to make the above objectives, features, and advantages of the present disclosure clearer and more understandable, the present disclosure will be further described in conjunction with the accompanying drawings and embodiments. However, exemplary embodiments can be implemented in a variety of forms, and should not be construed as being limited by the embodiments described herein; on the contrary, these embodiments are provided to make the present disclosure more comprehensive and complete, and the concepts of the exemplary embodiments are comprehensively shown to those skilled in the art. The same reference numerals in the figures represent the same or similar structures, and therefore repeated description about them will be omitted. The words representing positions and directions described in the present disclosure are all illustrated by taking the accompanying drawings as examples, but changes can also be made as required, and all these changes shall be included in the protection scope of the present disclosure. The accompanying drawings of the present disclosure are merely used to illustrate relative position relationships rather than to represent true proportions.

It should be noted that specific details are described in the following description in order to fully understand the present disclosure. However, the present disclosure can be implemented in a variety of other ways different from those described herein, and those skilled in the art can make similar promotion without departing from the nature of the present disclosure. Therefore, the present disclosure is not limited by the specific embodiments disclosed below. The follow-up description of the specification is a preferred embodiment for implementing the present disclosure, but it is intended to explain the general principles of the present disclosure rather than limit the scope of the present disclosure. The protection scope of the present disclosure shall be subject to those defined by the appended claims.

The display panel and the display device provided by an embodiment of the present disclosure will be described in detail below in conjunction with the accompanying drawings.

The display panel requires a narrow frame and has a special-shaped area. Therefore, when the loading capacity of scanning signal lines corresponding to the special-shaped area is to be compensated, the positions corresponding to the first several rows of pixels in the special-shaped area are most limited by a space. However, these several rows of pixels generally display unimportant information. Therefore, the present disclosure compensates the scanning signal lines by utilizing a spare pixel space in a way of reducing a corresponding pixel density of the special-shaped area.

As shown in FIG. 2 to FIG. 8, the display panel provided by an embodiment of the present disclosure includes a display region. The display region includes a plurality of pixels 1, a plurality of scanning signal lines 2 and a plurality of fixed potential signal lines 3. The pixels 1 are arranged in an array, where each pixel 1 includes a light emitting device, and a drive circuit configured to drive the corresponding light emitting device. The scanning signal lines 2 extend in the first direction and are arranged in the second direction. The fixed potential signal lines 3 extend in the second direction and are arranged in the first direction. The first direction is intersected with the second direction.

The display region includes a first display region A0 and a second display region BO which are arranged in the second direction. Since there is a special-shaped area a in the first display region A0, each scanning signal line 2 in the first display region A0 is electrically connected with less pixels 1 than each scanning signal line 2 in the second display region BO.

The first display region A0 includes a first sub-display region A1 and a second sub-display region A2 which are arranged in the second direction, where the first sub-display region A1 is located on the side far away from the second display region BO, and the first sub-display region A1 has a smaller pixel density than the second display region BO.

The scanning signal lines 2 and the fixed potential signal lines 3 are arranged in different layers. In a direction perpendicular to the display panel, a first overlapping region exists between the scanning signal lines 2 and the fixed potential signal lines 3 in the first sub-display region A1, a second overlapping region exists between the scanning signal lines 2 and the fixed potential signal lines 3 in the second sub-display region A2, and a third overlapping region exists between the scanning signal lines 2 and the fixed potential signal lines 3 in the second display region BO.

The first overlapping region at least has a larger area than the third overlapping region.

Specifically, in the display panel provided by an embodiment of the present disclosure, a compensation space is reserved by adjusting pixel densities of the first sub-display region A1 and the second sub-display region A2 in the first display region A0; and widths or lengths of the scanning signal lines 2 and/or fixed potential signal lines 3 are adjusted to increase a parasitic capacitance between the scanning signal lines 2 and the fixed potential signal lines 3, compensate the load difference of the scanning signal lines 2, and improve the uniformity of display.

Figure 2:
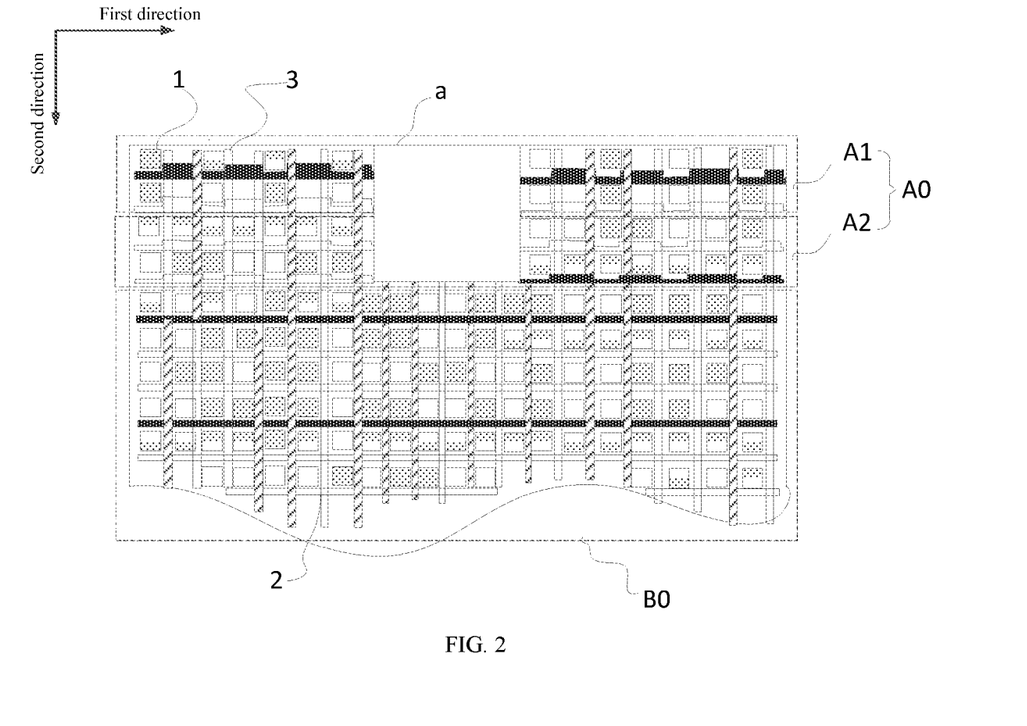
FIG. 2 is a schematic diagram of a structure of a display panel provided by an embodiment of the present disclosure.
Figure 3:
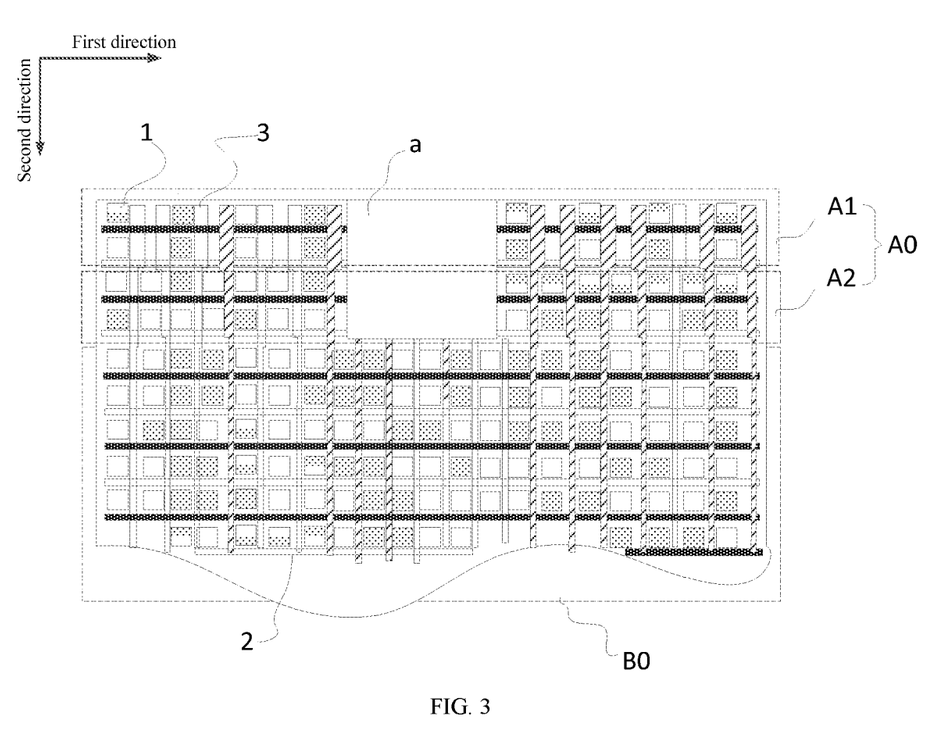
FIG. 3 is a schematic diagram of another structure of a display panel provided by an embodiment of the present disclosure.
Figure 4:
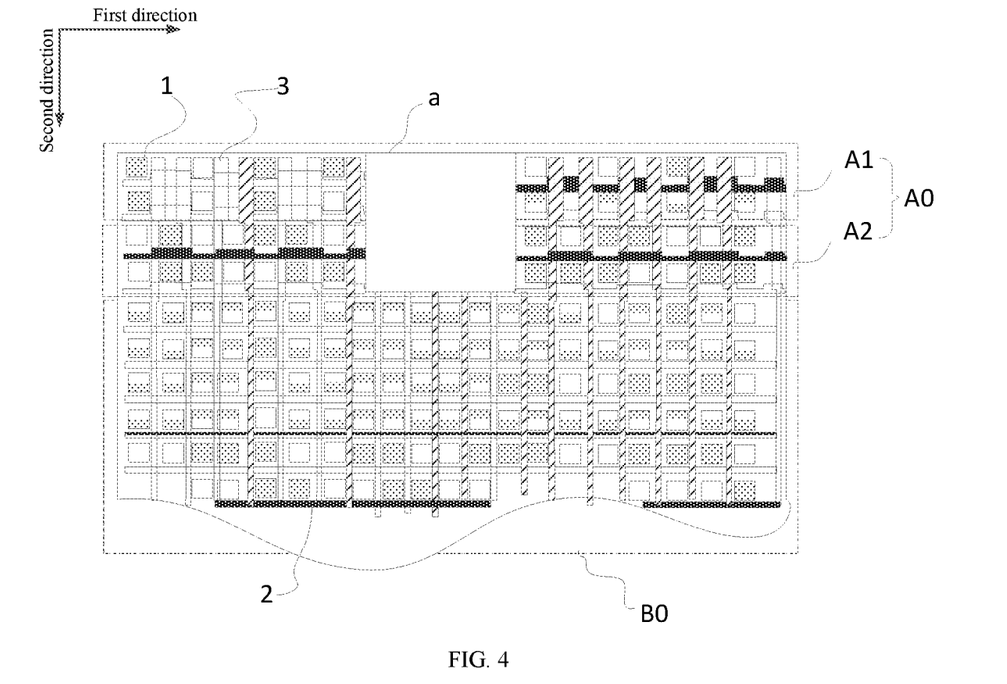
FIG. 4 is a schematic diagram of another structure of a display panel provided by an embodiment of the present disclosure.

Optionally, in the display panel provided by an embodiment of the present disclosure, as shown in FIG. 2 to FIG. 4, the second sub-display region A2 has a same pixel density as the second display region BO; and the light emitting devices in the first sub-display region A1 and the second sub-display region A2 are overlapped with the corresponding drive circuits.

Specifically, in the display panel provided by the embodiment of the present disclosure, in order to reserve a compensation area for the scanning signal lines 2 and/or the fixed potential signal lines 3 during compensation of the scanning signal lines 2 in the first sub-display region A1, the first sub-display region A1 is made to have a smaller pixel density than the second sub-display region A2, namely the pixels in the first sub-display region A1 are reduced, the area of the first overlapping region is increased by utilizing a spare space in a way of increasing widths of the scanning signal lines 2 and/or the fixed potential signal lines 3, namely a parasitic capacitance between the scanning signal lines 2 and the fixed potential signal lines 3 in the first sub-display region A1 is increased; and thus, a load difference between the scanning signal lines 2 in the first sub-display region A1 and the signal lines in other areas can be compensated.

Optionally, in the display panel provided by an embodiment of the present disclosure, as shown in FIG. 2 to FIG. 4, the first overlapping region may have a larger area than the second overlapping region, and the second overlapping region may have a larger area than the third overlapping region.

Specifically, in the display panel provided by an embodiment of the present disclosure, since the first sub-display region A1 has a smaller pixel density than the second sub-display region A2, the first overlapping region existing between the scanning signal lines 2 and the fixed potential signal lines 3 in the first sub-display region A1 has a larger area than the second overlapping region existing between the scanning signal lines 2 and the fixed potential signal lines 3 in the second sub-display region A2, and thus a load difference between the first sub-display region A1 and the second sub-display region A2 can be compensated. The second sub-display region A2 have the same pixel density as the second display region BO, but due to the existence of a special-shaped area, the scanning signal lines 2 in the second sub-display region A2 are connected with less pixels than the scanning signal lines 2 in the second display region BO. Therefore, the second overlapping region existing between the scanning signal lines 2 and the fixed potential signal lines 3 in the second sub-display region A2 should have a larger area than the third overlapping region existing between the scanning signal lines 2 and the fixed potential signal lines 3 in the second display region BO so as to compensate a load difference existing in the second sub-display region A2.

Optionally, in the display panel provided by an embodiment of the present disclosure, as shown in FIG. 2, when all the fixed potential signal lines 3 have the same width in the first direction, the scanning signal lines 2 in the first overlapping region are wider than the scanning signal lines 2 in the second overlapping region in the second direction, and the scanning signal lines 2 in the second overlapping region are wider than the scanning signal lines 2 in the third overlapping region in the second direction.

Optionally, in the display panel provided by an embodiment of the present disclosure, as shown in FIG. 3, when the respective scanning signal lines 2 have the same width in the second direction, the fixed potential signal lines 3 in the first overlapping region are wider than the fixed potential signal lines 3 in the second overlapping region in the first direction; and the fixed potential signal lines 3 in the second overlapping region are wider than the fixed potential signal lines 3 in the third overlapping region in the first direction.

Optionally, in the display panel provided by an embodiment of the present disclosure, as shown in FIG. 4, the scanning signal lines 2 in the first overlapping region are wider than the scanning signal lines 2 in the second overlapping region in the second direction; and the scanning signal lines 2 in the second overlapping region are wider than the scanning signal lines 2 in the third overlapping region in the second direction.

When the respective scanning signal lines 2 have the same width in the second direction, the fixed potential signal lines 3 in the first overlapping region are wider than the fixed potential signal lines 3 in the second overlapping region in the first direction, and the fixed potential signal lines 3 in the second overlapping region are wider than the fixed potential signal lines 3 in the third overlapping region in the first direction.

Specifically, in the display panel provided by the embodiment of the present disclosure, the area of the first overlapping region or the second overlapping region is increased in a way of increasing the width of the scanning signal lines 2 and/or the fixed potential signal lines 3, so as to compensate a loading difference of the scanning signal lines.

The area of an overlapping region can be increased by independently increasing the width of the scanning signal lines 2 or the fixed potential signal lines 3 or by increasing the width of both the scanning signal lines 2 and the fixed potential signal lines 3. A specific compensation way is selected according to a load difference of the scanning signal lines 2 and requirements on space, which is not specifically limited herein.

Figure 5:
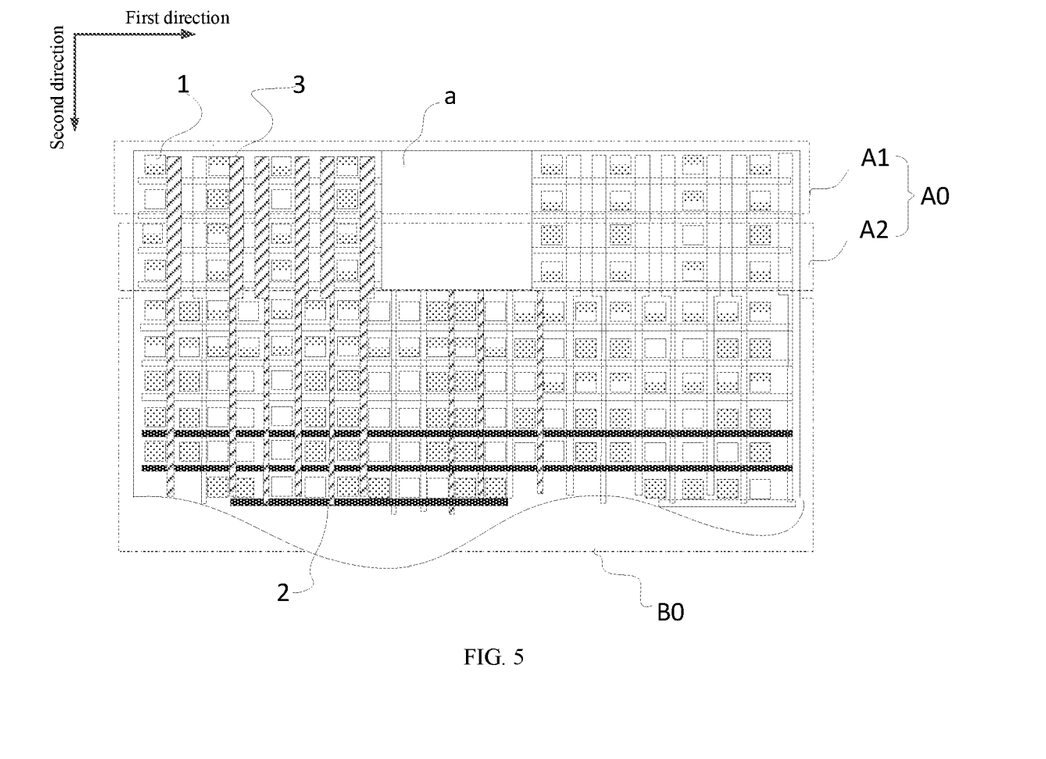
FIG. 5 is a schematic diagram of another structure of a display panel provided by an embodiment of the present disclosure.
Figure 6:
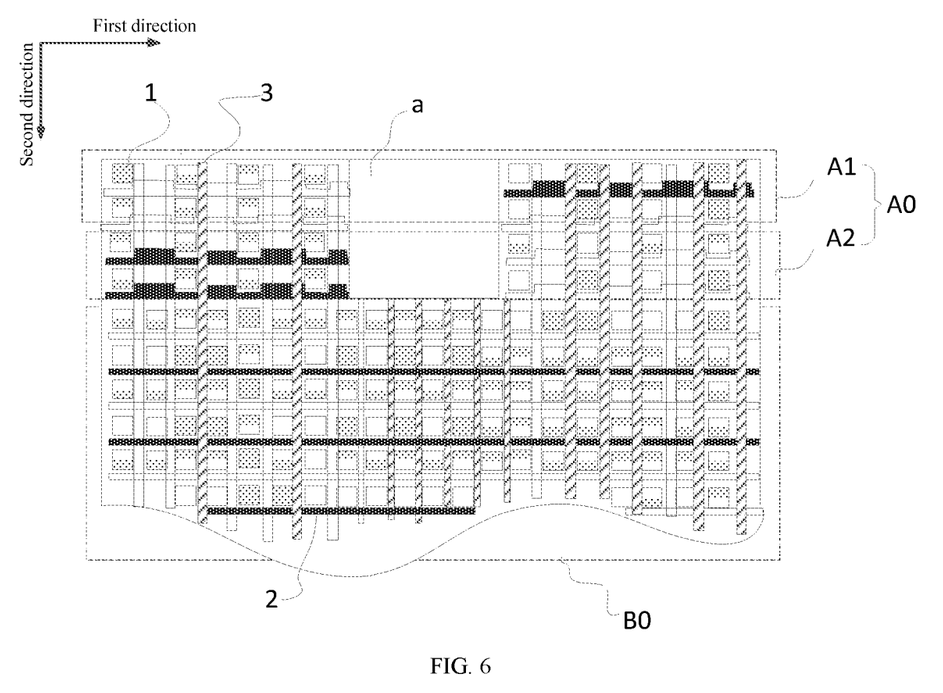
FIG. 6 is a schematic diagram of another structure of a display panel provided by an embodiment of the present disclosure.
Figure 7:
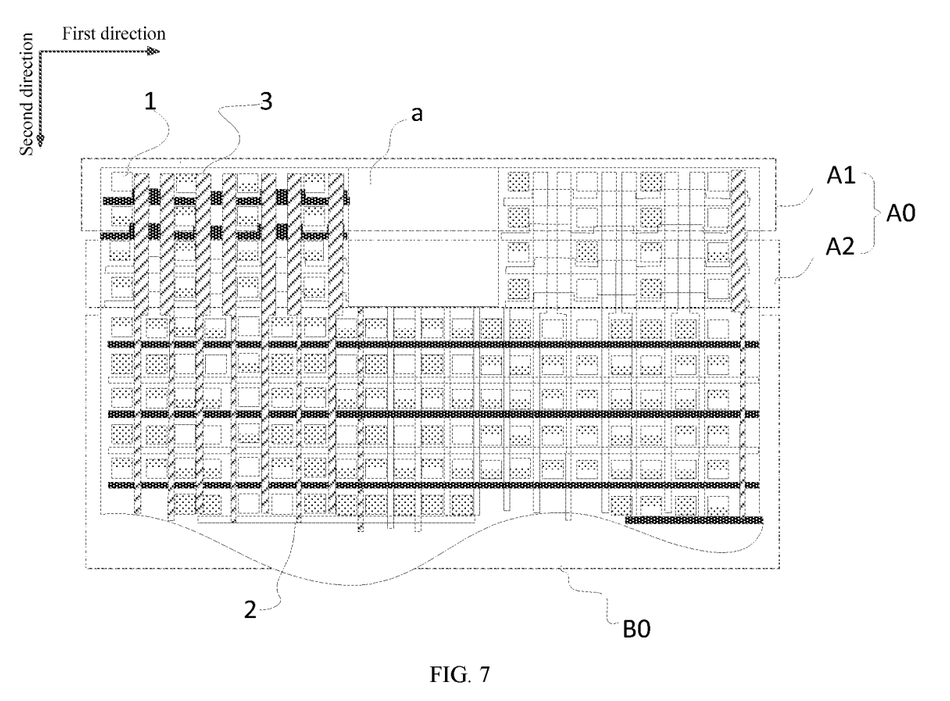
FIG. 7 is a schematic diagram of another structure of a display panel provided by an embodiment of the present disclosure.

Optionally, in the display panel provided by the embodiment of the present disclosure, as shown in FIG. 5 to FIG. 7, the first sub-display region A1 has the same pixel density as the second sub-display region A2; each drive circuit configured to drive the corresponding light emitting device in the first sub-display region A1 is arranged in the second sub-display region A2; and the scanning signal lines 2 located in the first sub-display region A1 are electrically connected with the corresponding drive circuits located in the second sub-display region A2.

Specifically, in the display panel provided by the embodiment of the present disclosure, the drive circuits corresponding to the pixels in the first sub-display region A1 are arranged in the second sub-display region A2, so that there is a sufficient wiring space for the scanning signal lines 2 and the fixed potential signal lines 3 in the first sub-display region A1, thus the area of an overlapping region can be increased in a way of increasing a length or width of the scanning signal lines 2 and/or the fixed potential signal lines 3. In this way, a loading capacity of the scanning signal lines 2 can be increased, and a load difference of the corresponding scanning signal lines 2 can be compensated.

Optionally, in the display panel provided by an embodiment of the present disclosure, the first overlapping region has the same area as the second overlapping region.

Specifically, in the display panel provided by the embodiment of the present disclosure, since the drive circuits corresponding to the pixels in the first sub-display region A1 are arranged in the second sub-display region A2, the second sub-display region A2 need to have a smaller pixel density to keep a space for downwards-pulled drive circuits. A pixel density in the first sub-display region A1 may be set to be equal to a pixel density in the second sub-display region A2, namely before the compensation of the first sub-display region A1 and the second sub-display region A2, the respective scanning signal lines 2 have the same loading capacity. Therefore, when the first overlapping region has the same area as the second overlapping region, a load difference between the respective scanning signal lines 2 in the first sub-display region A1 and the second sub-display region A2 can be compensated.

Optionally, in the display panel provided by an embodiment of the present disclosure, as shown in FIG. 5, when the respective scanning signal lines 2 have the same width in the second direction, the fixed potential signal lines 3 in the first overlapping region have the same width as the fixed potential signal lines 3 in the second overlapping region in the first direction; and the fixed potential signal lines 3 in the first overlapping region are wider than the fixed potential signal lines 3 in the third overlapping region in the first direction.

Optionally, in the display panel provided by an embodiment of the present disclosure, as shown in FIG. 6, when the respective fixed potential signal lines 3 have the same width in the first direction, the scanning signal lines 2 in the first overlapping region have the same width as the scanning signal lines 2 in the second overlapping region in the second direction, and the scanning signal lines 2 in the first overlapping region are wider than the scanning signal lines 2 in the third overlapping region in the second direction.

Optionally, in the display panel provided by an embodiment of the present disclosure, as shown in FIG. 7, the fixed potential signal lines 3 in the first overlapping region have the same width as the fixed potential signal lines 3 in the second overlapping region in the first direction; and the fixed potential signal lines 3 in the first overlapping region are wider than the fixed potential signal lines 3 in the third overlapping region in the first direction.

The scanning signal lines 2 in the first overlapping region have the same width as the scanning signal lines 2 in the second overlapping region in the second direction, and the scanning signal lines 2 in the first overlapping region are wider than the scanning signal lines 2 in the third overlapping region in the second direction.

Specifically, in the display panel provided by the embodiment of the present disclosure, the area of the first overlapping region or the second overlapping region may be increased in a way of increasing a width of the scanning signal lines 2 and/or the fixed potential signal lines 3, so as to compensate a loading difference of the scanning signal lines.

The area of an overlapping region can be increased by independently increasing widths of the scanning signal lines 2 or the fixed potential signal lines 3 or by increasing widths of both the scanning signal lines 2 and the fixed potential signal lines 3. A specific compensation way is selected according to a load difference of the scanning signal lines 2 and requirements on space, which is not specifically limited herein.

Specifically, in the display panel provided by the embodiment of the present disclosure, since there is a sufficient space in the first sub-display region A1 to arrange the scanning signal lines 2 and the fixed potential signal lines 3, the area of the first overlapping region can be adjusted in a way of adjusting lengths of the scanning signal lines 2 and/or the fixed potential signal lines 3; for example, each signal line can be configured as a circuitous curved line to increase an overlapping region between the scanning signal lines 2 and the fixed potential signal lines 3. Also, the area of the first overlapping region can be adjusted in a way of adjusting the widths of the scanning signal lines 2 and/or the fixed potential signal lines 3. A specific adjustment method is selected according to an actual application condition, which is not specifically limited herein.

Figure 8:
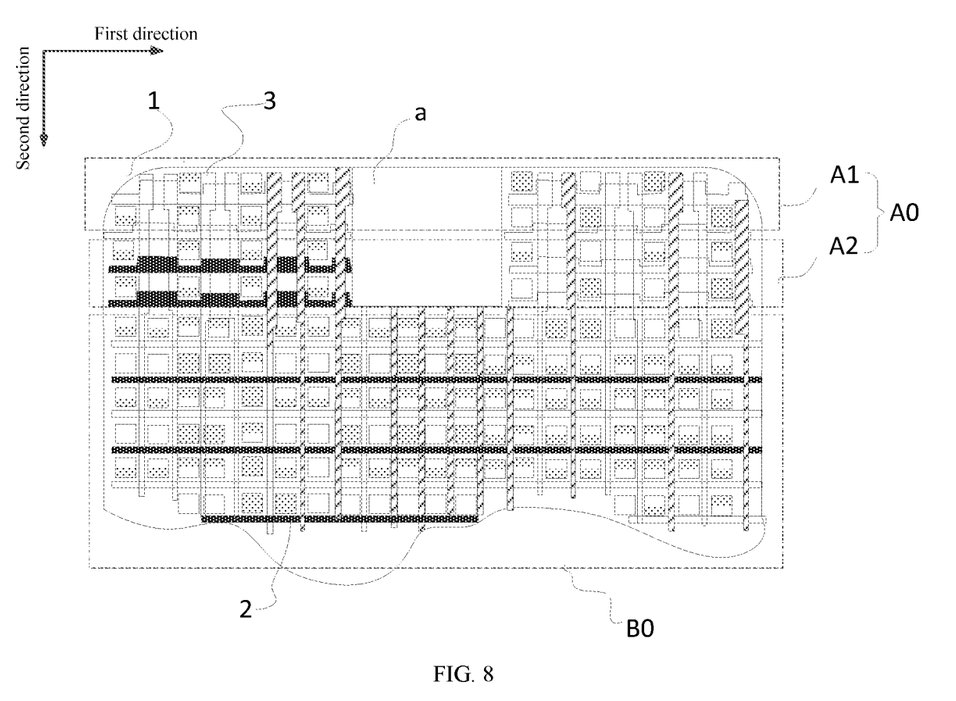
FIG. 8 is a schematic diagram of another structure of a display panel provided by an embodiment of the present disclosure.

Optionally, in the display panel provided by the embodiment of the present disclosure, as shown in FIG. 8, the first sub-display region A1 includes first pixel rows and second pixel rows different in pixel quantity, and the first pixel rows have less pixels than the second pixel rows; and the first overlapping region corresponding to the first pixel rows has a larger area than the first overlapping region corresponding to the second pixel rows.

Specifically, in the display panel provided by the embodiment of the present disclosure, four corners of the display panel can be configured as chamfers, such that the scanning signal lines 2 in the first sub-display region A1 are connected with different numbers of pixels. Therefore, in order to compensate a load difference of the scanning signal lines 2 in the first sub-display region A1, the area of the first overlapping region existing between the scanning signal lines 2 and the fixed potential signal lines 3 connected with less pixels can be increased to compensate the load difference.

Optionally, in the display panel provided by an embodiment of the present disclosure, when the respective scanning signal lines 2 have the same width in the second direction, the fixed potential signal lines 3 in the first overlapping region corresponding to the first pixel rows are wider than the fixed potential signal lines 3 in the first overlapping region corresponding to the second pixel rows in the first direction.

Optionally, in the display panel provided by an embodiment of the present disclosure, when the respective fixed potential signal lines 3 have the same width in the first direction, the scanning signal lines 2 in the first overlapping region corresponding to the first pixel rows are wider than the scanning signal lines 2 in the first overlapping region corresponding to the second pixel rows in the second direction.

Optionally, in the display panel provided by an embodiment of the present disclosure, as shown in FIG. 8, the fixed potential signal lines 3 in the first overlapping region corresponding to the first pixel rows are wider than the fixed potential signal lines 3 in the first overlapping region corresponding to the second pixel rows in the first direction; and the scanning signal lines 2 in the first overlapping region corresponding to the first pixel rows are wider than the scanning signal lines 2 in the first overlapping region corresponding to the second pixel rows in the second direction.

Optionally, in the display panel provided by an embodiment of the present disclosure, the scanning signal lines 2 includes grid scanning signal lines and light emission control scanning signal lines. The fixed potential signal lines 3 include power voltage signal lines.

Optionally, in the display panel provided by an embodiment of the present disclosure, at least a partial edge of the first display region A0 is a curved edge, a round corner, a chamfer or a notch, and each pixel row in the first display region A0 generally extends to the curved edge, the round corner, the chamfer or the notch.

Optionally, in the display panel provided by an embodiment of the present disclosure, the first display region A0 includes a gap or a hollow part, and each pixel row in the first display region A0 generally extends to the gap or the hollow part.

The position of the gap or hollow part in the first display region A0 can be selected according to actual situations, for example, the gap or hollow part may be located at a position close to the middle of an upper frame, or may be located on the left and right sides, which is not specifically limited herein.

Based on the same inventive concept, an embodiment of the present disclosure further provides a display device including the display panel provided by any one of the above embodiments.

Figure 9:
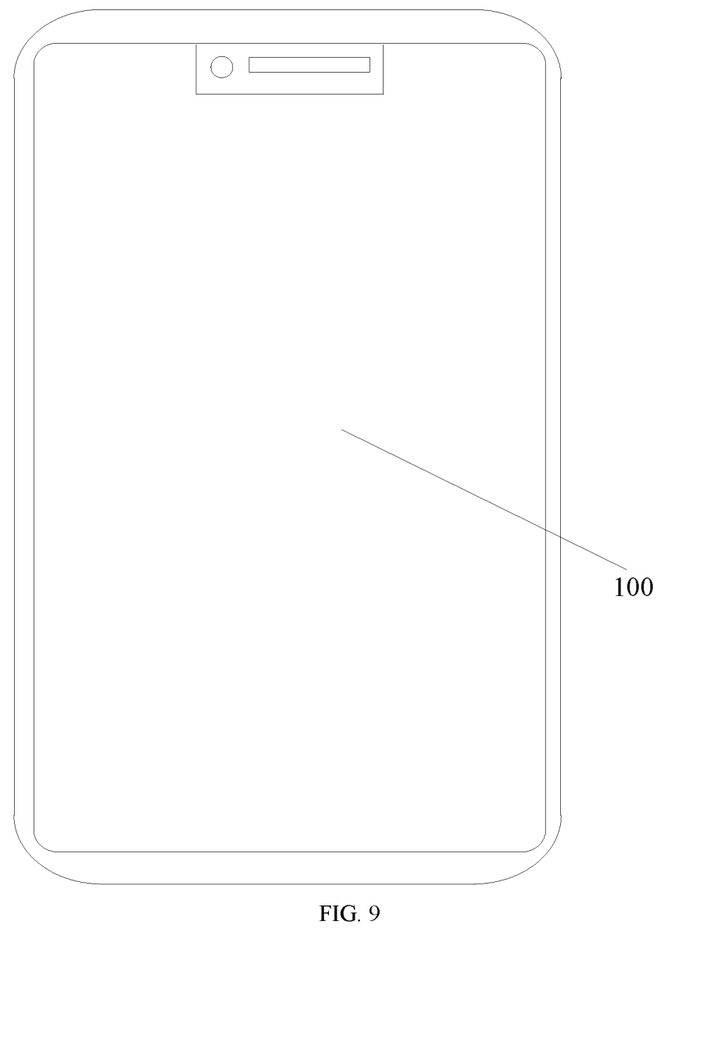
FIG. 9 is a schematic diagram of a structure of a display device provided by an embodiment of the present disclosure.

The display device may be a display device such as a liquid crystal display, a liquid crystal television, an organic light-emitting diode (OLED) display, an OLED TV, etc., or may be a mobile device such as a mobile phone, a tablet computer, a notebook computer, a smart watch, a smart bracelet, VR/AR glasses, etc. FIG. 9 shows a top view of the above display device provided by an embodiment of the present disclosure when the display device is a mobile phone, where a display screen 100 can adopt the structure of any one of the above display panels, which is not limited herein. Since the display device provided by this embodiment includes the display panel described in the above embodiment, it accordingly has the relevant advantages of the above display panel. This display device can be implemented with reference to an embodiment of the above display panel, and repeated contents will not be described again.

An embodiment of the present disclosure provides the display panel and the display device, where the display panel includes the display region; the display region internally includes a plurality of pixels arranged in an array, a plurality of scanning signal lines extending in the first direction and arranged in the second direction, a plurality of fixed potential signal lines extending in the second direction and arranged in the first direction; the first direction is intersected with the second direction; the display region includes the first display region and the second display region which are arranged in the second direction; each scanning signal line in the first display region is electrically connected with less pixels than each scanning signal line in the second display region; the first display region includes a first sub-display region and a second sub-display region which are arranged in the second direction; the first sub-display region is located on the side far away from the second display region; the first sub-display region has a smaller pixel density than the second display region; the scanning signal lines and the fixed potential signal lines are arranged in different layers; in a direction perpendicular to the display panel, the first overlapping region exists between the scanning signal lines and the fixed potential signal lines in the first sub-display region; the second overlapping region exists between the scanning signal lines and the fixed potential signal lines in the second sub-display region; and the third overlapping region exists between the scanning signal lines and the fixed potential signal lines in the second display region, where the first overlapping region at least has a larger area than the third overlapping region. A compensation space is reserved by adjusting the pixel density of the first sub-display region and the second sub-display region in the first display region; and a width or length of the scanning signal lines and/or fixed potential signal lines is adjusted to increase a parasitic capacitance between the scanning signal lines and the fixed potential signal lines, thereby compensating the load difference of the scanning signal lines, and improving the uniformity of display.

Although the preferred embodiments of the present disclosure have been described, those skilled in the art can make other changes and modifications of these embodiments once they learn the basic inventiveness concept. Therefore, the appended claims are intended to be interpreted as including the preferred embodiments and all changes and modifications falling within the scope of the present disclosure.

Apparently, various modifications and variations of the present disclosure can be made by those skilled in the art without departing from the spirit and scope of the present disclosure. Therefore, if these modifications and variations of the present disclosure fall within the scope of the claims of the present disclosure and their equivalent technologies, the present disclosure is also intended to include these modifications and variations.

What is claimed is:

1. A display panel, comprising:
a display region, comprising a first display region and a second display region arranged in a second direction, wherein the first display region comprises a first sub-display region and a second sub-display region arranged in the second direction, the first sub-display region is located at a side far away from the second display region, and the first sub-display region, the second sub-display region and the second display region each comprise:
a plurality of pixels arranged in an array, wherein a pixel density of the first sub-display region is smaller than a pixel density of the second display region;
a plurality of scanning signal lines, extending in a first direction and arranged in the second direction, wherein a quantity of pixels electrically connected to each scanning signal line in the first display region is less than a quantity of pixels electrically connected to each scanning signal line in the second display region, and the first direction is intersected with the second direction; and
a plurality of fixed potential signal lines, extending in the second direction and arranged in the first direction, wherein the scanning signal lines and the fixed potential signal lines are arranged in different layers; in a direction perpendicular to the display panel, a first overlapping region exists between the scanning signal lines and the fixed potential signal lines in the first sub-display region, a second overlapping region exists between the scanning signal lines and the fixed potential signal lines in the second sub-display region, a third overlapping region exists between the scanning signal lines and the fixed potential signal lines in the second display region, and an area of the first overlapping region is at least larger than an area of the third overlapping region;
wherein the pixel density of the first sub-display region is equal to a pixel density of the second sub-display region;
wherein each pixel comprises a light emitting device, and a drive circuit configured to drive the light emitting device; drive circuits of pixels in the first sub-display region are located in the second sub-display region; and the scanning signal lines located in the first sub-display region are electrically connected to corresponding drive circuits located in the second sub-display region.

2. The display panel according to claim 1, wherein the area of the first overlapping region is equal to an area of the second overlapping region.

3. The display panel according to claim 2, wherein the scanning signal lines have a same width in the second direction; and
widths of the fixed potential signal lines in the first overlapping region in the first direction are equal to widths of the fixed potential signal lines in the second overlapping region in the first direction, and the widths of the fixed potential signal lines in the first overlapping region in the first direction are larger than widths of the fixed potential signal lines in the third overlapping region in the first direction.

4. The display panel according to claim 2, wherein the fixed potential signal lines have a same width in the first direction; and widths of the scanning signal lines in the first overlapping region in the second direction are equal to widths of the scanning signal lines in the second overlapping region in the second direction, and the widths of the scanning signal lines in the first overlapping region in the second direction are larger than widths of the scanning signal lines in the third overlapping region in the second direction.

5. The display panel according to claim 2, wherein widths of the fixed potential signal lines in the first overlapping region in the first direction are equal to widths of the fixed potential signal lines in the second overlapping region in the first direction, and the widths of the fixed potential signal lines in the first overlapping region in the first direction are larger than widths of the fixed potential signal lines in the third overlapping region in the first direction; and widths of the scanning signal lines in the first overlapping region in the second direction are equal to widths of the scanning signal lines in the second overlapping region in the second direction, and the widths of the scanning signal lines in the first overlapping region in the second direction are larger than widths of the scanning signal lines in the third overlapping region in the second direction.

6. The display panel according to claim 1, wherein the first sub-display region comprises first pixel rows and second pixel rows; a quantity of pixels in the first pixel rows is less than a quantity of pixels in the second pixel rows; and an area of the first overlapping region corresponding to the first pixel rows is larger than an area of the first overlapping region corresponding to the second pixel rows.

7. The display panel according to claim 6, wherein the scanning signal lines have a same width in the second direction; and in the first direction, widths of the fixed potential signal lines in the first overlapping region corresponding to the first pixel rows are larger than widths of the fixed potential signal lines in the first overlapping region corresponding to the second pixel rows.

8. The display panel according to claim 6, wherein the fixed potential signal lines have a same width in the first direction; and in the second direction, widths of the scanning signal lines in the first overlapping region corresponding to the first pixel rows are larger than widths of the scanning signal lines in the first overlapping region corresponding to the second pixel rows.

9. The display panel according to claim 6, wherein in the first direction, widths of the fixed potential signal lines in the first overlapping region corresponding to the first pixel rows are larger than widths of the fixed potential signal lines in the first overlapping region corresponding to the second pixel rows; and in the second direction, widths of the scanning signal lines in the first overlapping region corresponding to the first pixel rows are larger than widths of the scanning signal lines in the first overlapping region corresponding to the second pixel rows.

10. The display panel according to claim 1, wherein the scanning signal lines comprise grid scanning signal lines and light emission control scanning signal lines; and the fixed potential signal lines comprise power voltage signal lines.

11. The display panel according to claim 1, wherein at least a partial edge of the first display region is a curved edge, a round corner, a chamfer or a notch, and each pixel row in the first display region extends to the curved edge, the round corner, the chamfer or the notch.

12. The display panel according to claim 1, wherein the first display region comprises a gap or a hollow part, and each pixel row in the first display region extends to the gap or the hollow part.

13. A display device, comprising a display panel, wherein the display panel comprises:

a display region, comprising a first display region and a second display region arranged in a second direction, wherein the first display region comprises a first sub-display region and a second sub-display region arranged in the second direction, the first sub-display region is located at a side far away from the second display region, and the first sub-display region, the second sub-display region and the second display region each comprise:

a plurality of pixels arranged in an array, wherein a pixel density of the first sub-display region is smaller than a pixel density of the second display region;

a plurality of scanning signal lines, extending in a first direction and arranged in the second direction, wherein a quantity of pixels electrically connected to each scanning signal line in the first display region is less than a quantity of pixels electrically connected to each scanning signal line in the second display region, and the first direction is intersected with the second direction; and a plurality of fixed potential signal lines, extending in the second direction and arranged in the first direction, wherein the scanning signal lines and the fixed potential signal lines are arranged in different layers; in a direction perpendicular to the display panel, a first overlapping region exists between the scanning signal lines and the fixed potential signal lines in the first sub-display region, a second overlapping region exists between the scanning signal lines and the fixed potential signal lines in the second sub-display region, a third overlapping region exists between the scanning signal lines and the fixed potential signal lines in the second display region, and an area of the first overlapping region is at least larger than an area of the third overlapping region;

wherein the pixel density of the first sub-display region is equal to a pixel density of the second sub-display region;

wherein each pixel comprises a light emitting device, and a drive circuit configured to drive the light emitting device; drive circuits of pixels in the first sub-display region are located in the second sub-display region; and the scanning signal lines located in the first sub-display region are electrically connected to corresponding drive circuits located in the second sub-display region.

\* \* \* \* \*